United States Patent [19]
Hamada

[11] Patent Number: 4,794,243
[45] Date of Patent: Dec. 27, 1988

[54] INTEGRATED CIRCUIT CARD WITH INCREASED NUMBER OF CONNECTING TERMINALS

[75] Inventor: Yoshitaka Hamada, Kawasaki, Japan

[73] Assignee: Mips Co., Ltd., Tokyo, Japan

[21] Appl. No.: 147,570

[22] Filed: Jan. 19, 1988

Related U.S. Application Data

[63] Continuation of Ser. No. 804,488, Dec. 4, 1985, abandoned.

[30] Foreign Application Priority Data

Mar. 16, 1985 [JP] Japan .............................. 60-37898[U]

[51] Int. Cl.⁴ .......................................... G06K 19/06
[52] U.S. Cl. ................................................... 235/492
[58] Field of Search .......................................... 235/492

[56] References Cited

U.S. PATENT DOCUMENTS

| | | | |
|---|---|---|---|
| 3,699,311 | 10/1972 | Dunbar | 235/492 |
| 3,702,464 | 11/1972 | Castorucci | 235/492 |
| 3,719,804 | 3/1973 | Illing | 235/492 |
| 3,861,775 | 1/1975 | Makins . | |
| 3,876,865 | 4/1975 | Bliss | 235/492 |
| 3,928,750 | 12/1975 | Wolflingseder | 235/492 |
| 4,095,866 | 6/1978 | Merrill . | |
| 4,326,214 | 4/1982 | Trueblood . | |
| 4,361,756 | 11/1982 | Parmentier . | |
| 4,423,317 | 12/1983 | Berezowski | 235/482 |
| 4,460,915 | 7/1984 | Engel . | |
| 4,532,419 | 7/1985 | Takeda . | |
| 4,550,248 | 10/1985 | Hoppe et al. . | |

FOREIGN PATENT DOCUMENTS

| | | |
|---|---|---|
| 0121268 | 3/1983 | European Pat. Off. . |
| 0134110 | 3/1985 | European Pat. Off. . |
| 2016485 | 10/1971 | Fed. Rep. of Germany . |
| 58-207656 | 12/1983 | Japan . |
| 59-167037 | 9/1984 | Japan . |
| 60-76151 | 4/1985 | Japan . |

OTHER PUBLICATIONS

European Search Report, regarding EP Application No. 85 30 6897, 9/4/86.

Primary Examiner—Harold I. Pitts
Attorney, Agent, or Firm—Birch, Stewart, Kolasch & Birch

[57] ABSTRACT

An integrated circuit card for use in an electronic arrangement when inserted into a receiving slot of the arrangement includes a card body having a flat and rectangular shape, a printed circuit board mounted on the card body, and an integrated circuit chip carried on the circuit board. The circuit board has a plurality of rows of connecting terminals which are arranged along an edge of the rectangular shape of the card body for establishing electrical connections with mating connecting terminals of a receiving slot of the electronic arrangement into which slot the card is inserted. The circuit board also has connecting wires printed thereon for electrically connecting circuitry of the chip with the rows of connecting terminals.

4 Claims, 2 Drawing Sheets

4,794,243

INTEGRATED CIRCUIT CARD WITH INCREASED NUMBER OF CONNECTING TERMINALS

This application is a continuation of application Ser. No. 804,488, filed on Dec. 4, 1985, now abandoned.

BACKGROUND OF THE INVENTION

1. Field of the Invention

The present invention relates to an integrated circuit card, and more particularly to an integrated circuit card specifically for use in an electronic apparatus, such as a personal computer, a hand-held computer, and a TV game machine.

2. Description of the Prior Art

An integrated circuit (IC) card consists of a compact, thin, inflexible card body, which typically measures about 85.6 mm long, 54 mm wide, and 0.8–2.0 mm thick. An IC chip (integrated circuit device) having desired functions is built into such a rigid or semi-rigid card body made of plastic or reinforced cardboard, and numerous connecting terminals are arranged along an edge on the surface of the card.

On the card of this type, an IC chip is built into a card by inserting a printed circuit board having the IC chip mounted into a rectangular hollow positioned near the card edge on the surface of the card body, with the chip mounting surface opposing the hollow, and by fixing the board with adhesive. On the board are printed wire connections for connecting the circuitry in the chip with connector terminals. The terminals are printed metal terminals which are arranged in the form of a single line or row along the board edge corresponding to the card edge on the board surface opposite the IC chip mounting surface, and are connected to the corresponding printed wires via throughholes.

When the card is inserted into a card receiving slot on a piece of electronic equipment, such as a personal computer, hand-held computer, or TV game machine, wtth the card edge having the terminals in the direction of insertion, the terminals on the card and the corresponding terminals on the connectors of the slot into which the card is inserted come in contact with each other to conduct current therebetween. As a result, the IC chip on the card is connected to the circuitry in the electronic equipment so that information may be transferred between them.

The number of terminals arranged along the card edge on the card surface may vary depending on the functions of the circuitry built in the IC chip. When a larger number of terminals is desired, the required number of terminals has to be closely arranged by reducing the intervals between adjacent ones of the terminals, or reducing the width of the individual terminals, since the card width is virtually fixed at about 54 mm as mentioned above.

Reduction of the intervals or the width, however, may cause problems of electromagnetic interference, short-circuiting between the terminals due to minute dirt and dust, particles misalignment between the terminals on the card and the terminals on the electronic equipment due to deviation of the card insertion position, and so forth.

Therefore, the reduction of the intervals and width in order to increase the required number of terminals by closer arrangement has limits.

SUMMARY OF THE INVENTION

It is, therefore, an object of the present invention to provide an IC card which contains an increased number of connecting terminals without incurring any of the problems mentioned above.

The foregoing object is accomplished by arranging two or more transverse rows of connecting terminals along an edge on the surface of an IC card.

BRIEF DESCRIPTION OF THE DRAWINGS

The objects and features of the present invention will become more apparent from the following detailed description taken in conjunction with the accompanying drawings in which.

DESCRIPTION OF THE PREFERRED EMBODIMENTS

Figure 2A:
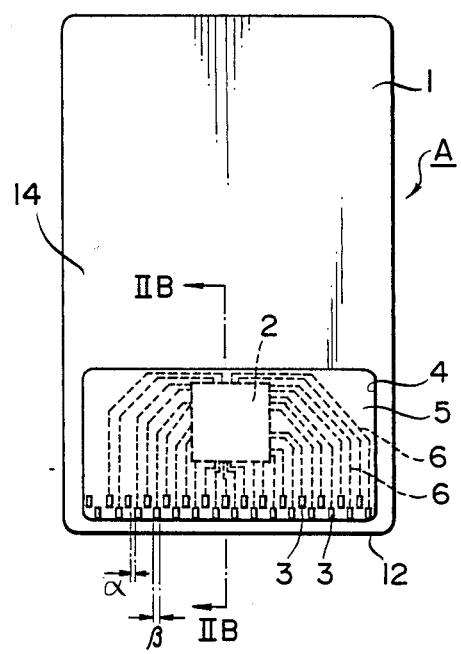
FIG. 2A is a plan view showing an embodiment of the invention.

With reference to FIG. 2A, an IC card A in accordance with an embodiment of the present invention consists of a compact, thin, inflexible card body 1 specifically measuring about 85.6 mm long, 54 mm wide, and 0.8–2.0 mm thick. An IC chip 2 (integrated circuit device) having desired functions is built into the rigid or semi-rigid card body 1, which may preferably be made of plastic or reinforced cardboard. A plurality of rows of connecting terminals 3 are arranged along an edge 12 on a primary surface 14 of the card A.

On the card A of this embodiment, IC chip 2 is built into the card A, by inserting a printed circuit board 5 having the IC chip 2 mounted into a rectangular, shallow hollow 4 positioned near the card edge 12 on the surface 14 of the card body 1, with the mounting surface of chip 2 facing the bottom of hollow 4, and by fixing in turn the board 5 with adhesive thereon. On board 5 are printed wire connections 6 for connecting the circuitry included in chip 2 to connector terminals 3. Terminals 3 are printed metal terminals which are arranged along the board edge which is substantially parallel to the card edge 12 on the board surface opposite the IC chip mounting surface, and are connected to the associated printed wires 6 via throughholes.

Figure 1:
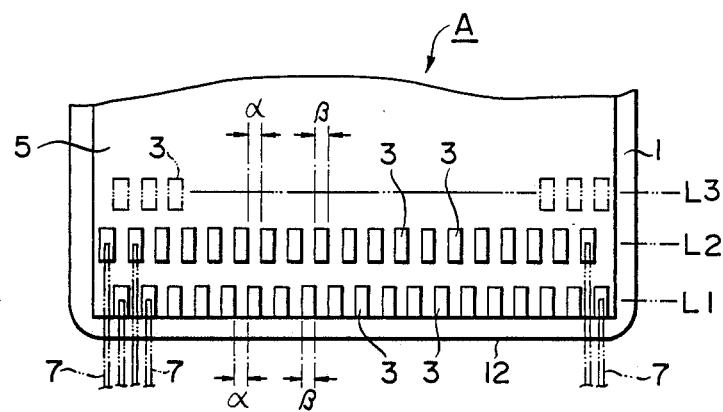
FIG. 1 is an enlarged plan view showing the major portion of an embodiment of an IC card in accordance with the present invention shown in FIG. 2A.

With reference to FIG. 1, hhich illustrates a portion of the embodiment of the present invention, IC card A has a total of 38 circuit terminals which are arranged in two rows L1 and L2, each row having 19 terminals 3. The terminal rows L1 and L2 are arranged in a staggered form, as clearly depicted in the figure.

The intervals α between adjacent ones of terminals 3 in the terminal rows L1 and L2 and the width β of an individual terminal 3 may be set easily in such a manner as to avoid any problems, since the number of terminals 3 in each row is small. An increase of terminal rows to three rows (L3) or more, which are also staggered, may also accommodate a larger number of terminals 3 without posing any problems. In addition, such rows of terminals 3 may be arranged on opposite surfaces on the card A to accommodate a far larger number of terminals 3.

A series of connecting terminals 7 on an electronic arrangement make mating contact with the rows of terminals 3 on the card A when the card A is inserted into a receptacle slot of the electronic arrangement.

Figure 2B:
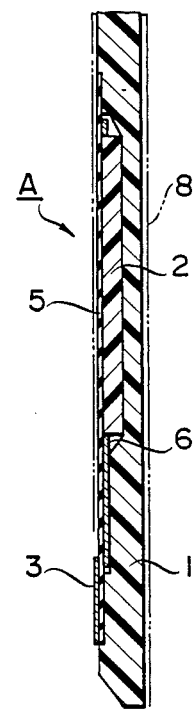
FIG. 2B is an enlarged longitudinal cross-sectional view of the major part of the IC card cut along the line IIB—IIB in FIG. 2A.

The card body 1 of the card A protects the built-in IC chip 2 from static electricity which may be developed by friction. In order to prevent electromagnetic wave noise from entering the circuitry of card A to shield the card circuitry, conductive film 8, FIG. 2B, which may preferably be electroplated film, metal film, or conductive coating, may be applied on areas other than the terminal arrangement area including rows L1 and L2 on the card A or on a required part of that area.

Figure 3:
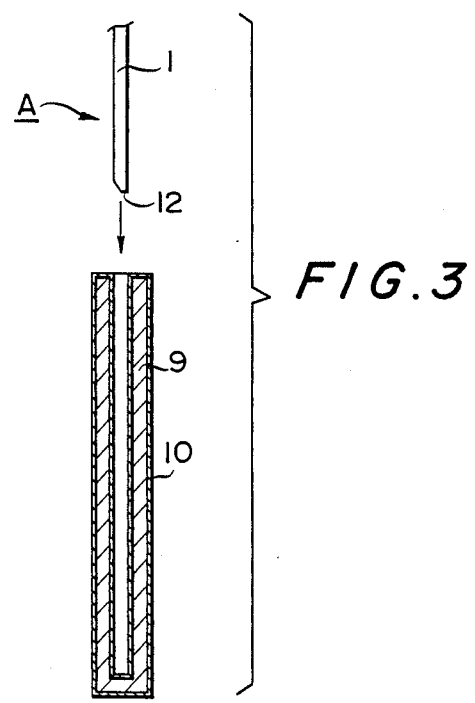
FIG. 3 is a longitudinal cross-sectional view of a card case.

Referring to FIG. 3, a protective case 9 is advantageously used for storing the card A. The case 9 may be made of conductive material to protect the built-in chip 2 on the stored card A from static electricity. In another alternative, the entire inner and outer surfaces or a required part of the surfaces of the case 9 may be covered with conductive film 10.

When the card A is inserted into a card slot on a piece of electronic equipment, not shown in the figure, such as a personal computer, hand-held computer, or a TV game machine, with the card edge 12 having the terminals 3 in the direction of insertion, the terminals 3 on the card A and the corresponding terminals 7 on the connectors of the electronic equipment into which the card A is inserted come in contact with each other to conduct current therebetween. As a result, the IC chip 2 on the card A is connected to the circuitry in the electronic equipment so that information may be transferred between them.

The circuit terminals 3 are arranged in two or more rows L1, L2 and L3 on the card surface 14 as mentioned above. The total required number of terminals 3 may therefore be accommodated by increasing the rows of terminals with the dimensions of the terminal interval α and the individual terminal width β kept the same, so that the foregoing difficulties of conventional IC cards are avoided.

As can be seen from the above dsscription, in accordance with the principle of this invention, a desired large number of circuit terminals may be placed on an IC card without incurring any problems.

While the present invention has been described with reference to the particular illustrative embodiment, it is not to be restricted by the embodiment but only by the appended claims. It is to be appreciated that those skilled in the art can change or modify the embodiment without departing from the scope and spirit of the present invention.

What is claimed is:

1. An integrated circuit card for use in an electronic arrangement when inserted into a receiving slot of the arrangement, comprising:
   a card body having a flat and rectangular shape;
   a printed circuit board mounted on said card body; and
   an integrated circuit chip carried on said circuit board, said chip being adhered to said circuit board and encapsulated by a molding adhesive;
   said circuit board having a plurality of rows of connecting terminals which are arranged parallel to an edge of the rectangular shape of said card body for establishing electrical connections with mating connecting terminals of a receiving slot of the electronic arrangement, into which slot said card body is inserted;
   said plurality of rows of connecting terminals being arranged in a staggered form between the adjacent rows with the connecting terminals of each of said rows intervening with respect to the direction parallel to the edge of the rectangular shape of said card body and between the respective connecting terminals of adjacent rows;
   said printed circuit board having connecting wires printed thereon for electrically connecting circuitry of said chip with said plurality of rows of connecting terminals.

2. An integrated circuit card in accordance with claim 1, wherein said plurality of rows of connecting terminals are arranged in two rows in a staggered form between the rows.

3. An integrated circuit card in accordance with claim 1, wherein said plurality of rows of connecting terminals are arranged in three rows in a staggered form between the adjacent rows.

4. An integrated circuit card in accordance with claim 1, wherein said plurality of rows of connecting terminals are arranged on opposite primary surfaces of said card body.

* * * * *